(12) United States Patent
Chien et al.

(10) Patent No.: US 12,289,921 B2
(45) Date of Patent: Apr. 29, 2025

(54) DISPLAY PANEL

(71) Applicant: Au Optronics Corporation, Hsinchu (TW)

(72) Inventors: I-Peng Chien, Hsinchu (TW);
Chen-Yuan Tu, Hsinchu (TW);
Cheng-Min Lu, Hsinchu (TW);
Wei-Chou Chen, Hsinchu (TW);
Hui-Min Sung, Hsinchu (TW); Tai-Tso Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 608 days.

(21) Appl. No.: 17/688,904

(22) Filed: Mar. 8, 2022

(65) Prior Publication Data
US 2023/0187457 A1    Jun. 15, 2023

(30) Foreign Application Priority Data
Dec. 13, 2021 (TW) .................................. 110146606

(51) Int. Cl.
| | |
|---|---|
| H10D 86/60 | (2025.01) |
| H01L 25/075 | (2006.01) |
| H01L 25/16 | (2023.01) |
| H10D 86/40 | (2025.01) |
| H01L 23/00 | (2006.01) |

(52) U.S. Cl.
CPC ......... *H10D 86/60* (2025.01); *H01L 25/0753* (2013.01); *H01L 25/167* (2013.01); *H10D 86/441* (2025.01); *H10D 86/451* (2025.01); *H01L 24/05* (2013.01); *H01L 24/13* (2013.01); *H01L 2224/05073* (2013.01); *H01L 2224/05562* (2013.01); *H01L 2224/05573* (2013.01);
(Continued)

(58) Field of Classification Search
CPC . H01L 25/167; H01L 25/0753; H01L 27/124; H01L 27/1248; H10D 86/441; H10D 86/451
See application file for complete search history.

(56) References Cited

U.S. PATENT DOCUMENTS

| 6,689,629 B2 | 2/2004 | Tsujimura et al. |
| 8,148,181 B2 | 4/2012 | Park et al. |

(Continued)

FOREIGN PATENT DOCUMENTS

| CN | 101515102 | 8/2009 |
| CN | 209691758 | 11/2019 |
| TW | 202001386 | 1/2020 |

*Primary Examiner* — Peter M Albrecht
(74) *Attorney, Agent, or Firm* — JCIPRNET

(57) ABSTRACT

A display panel has a plurality of pixel areas and a peripheral area surrounding the pixel areas, and includes a substrate, at least two planarization layers, a plurality of pads, a first dummy pattern, and a plurality of light-emitting devices. The substrate has a first substrate edge extending in a first direction. The at least two planarization layers are disposed on the substrate. The pads are disposed on the at least two planarization layers, and are located in the pixel areas. The pads include at least one first edge pad closest to the first substrate edge. The first dummy pattern is disposed on the at least two planarization layers, and extends in the peripheral area between the at least one first edge pad and the first substrate edge. The light-emitting devices are electrically connected to the pads.

19 Claims, 15 Drawing Sheets

(52) U.S. Cl.
CPC ............... *H01L 2224/05686* (2013.01); *H01L 2224/1308* (2013.01); *H01L 2224/13186* (2013.01)

(56) References Cited

U.S. PATENT DOCUMENTS

| | | |
|---|---|---|
| 8,410,484 B2 | 4/2013 | Park et al. |
| 11,211,012 B2 | 12/2021 | Hao et al. |
| 2009/0206339 A1 | 8/2009 | Park et al. |
| 2012/0153290 A1 | 6/2012 | Park et al. |
| 2021/0043147 A1 | 2/2021 | Hao et al. |
| 2022/0343810 A1* | 10/2022 | Kim ..................... H01L 25/167 |

* cited by examiner

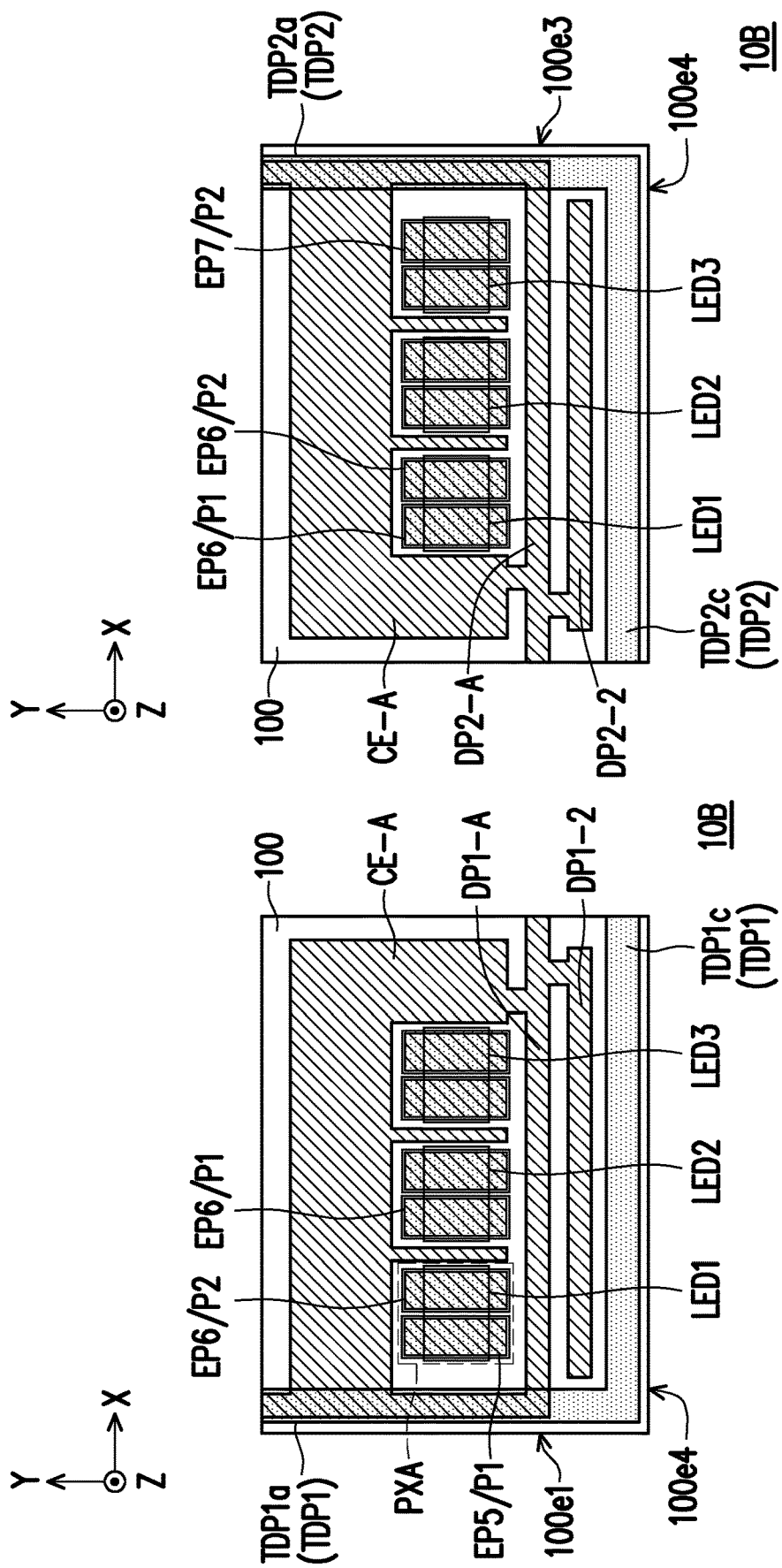

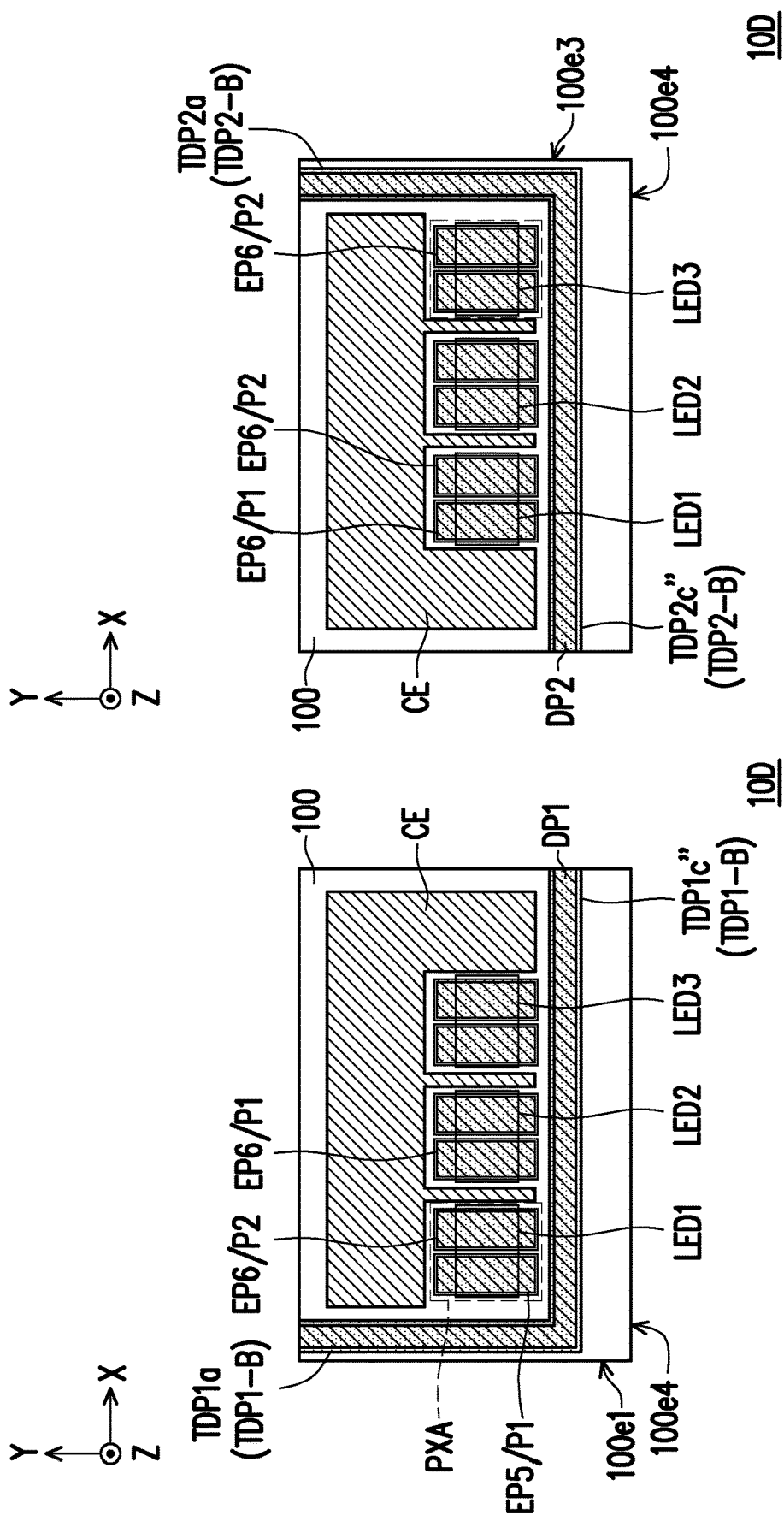

DISPLAY PANEL

CROSS-REFERENCE TO RELATED APPLICATION

This application claims the priority benefit of Taiwanese application no. 110146606, filed on Dec. 13, 2021. The entirety of the above-mentioned patent application is hereby incorporated by reference herein and made a part of this specification.

BACKGROUND

Technical Field

The disclosure relates to a display, and particularly relates to a display panel.

Description of Related Art

In recent years, under a circumstance that an organic light-emitting diode (OLED) display panel has relatively high manufacturing costs and an uncompetitive service life over current mainstream displays, a micro light-emitting diode (LED) display panel gradually attracts investment attention of major technology brands. The micro LED display panel has an optical performance approximately matching that of OLED display technology, such as high color saturation, fast response speed, and high contrast, and has low energy consumption and long material service life. To achieve lower production costs and greater product design margins, the manufacturing technology of the micro LED display adopts die transfer. For example, a die manufacturer needs to first fabricate (or place) micro LED dies required by customers on a temporary substrate, and then the micro LED dies stored on the temporary substrate are transferred and bonded to driving circuit boards of different products by the customers according to different application requirements.

Along with improvement of pixel resolution, designs of driving circuits are gradually trending toward complexity, and the numbers of used metal conductive layers and corresponding planarization layers are also gradually increased, resulting in a constant increase in heights of pads used for bonding the micro LEDs. When a slim border design is adopted for the display panel, during a patterning process of the pads on the outermost side and adjacent to a substrate edge, a definition of pad patterns is likely to be incomplete due to a loss of photoresist patterns. This may severely affect a bonding yield of the micro LED dies near the substrate edge, and cause reduction in a production yield of the display panels.

SUMMARY

The disclosure is directed to a display panel, in which a yield of pads at an edge is relatively high during a manufacturing process.

The disclosure provides a display panel having a plurality of pixel areas and a peripheral area surrounding the pixel areas. The display panel includes a substrate, at least two planarization layers, a plurality of pads, a first dummy pattern, and a plurality of light-emitting devices. The substrate has a first substrate edge on a side along a first direction. The at least two planarization layers are disposed on the substrate. The pads are disposed on the at least two planarization layers, and are located in the pixel areas. The pads include at least one first edge pad closest to the first substrate edge. The first dummy pattern is disposed on the at least two planarization layers, and extends in the peripheral area between the at least one first edge pad and the first substrate edge. The light-emitting devices are electrically connected to the pads.

Based on the above description, in the display panel of an embodiment of the disclosure, the dummy pattern is disposed in the peripheral area between the substrate edge and at least one edge pad that is disposed on the at least two planarization layers and is closest to the substrate edge. Accordingly, it is possible to avoid a case where the edge pads cannot be correctly defined due to a loss of photoresist materials during the patterning process, thereby improving the production yield of the display panel.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5A and FIG. 5B are schematic top views of a display panel according to a third embodiment of the disclosure.

FIG. 7A to FIG. 7D are schematic top views of a display panel according to a fifth embodiment of the disclosure.

DESCRIPTION OF THE EMBODIMENTS

Figure 1:
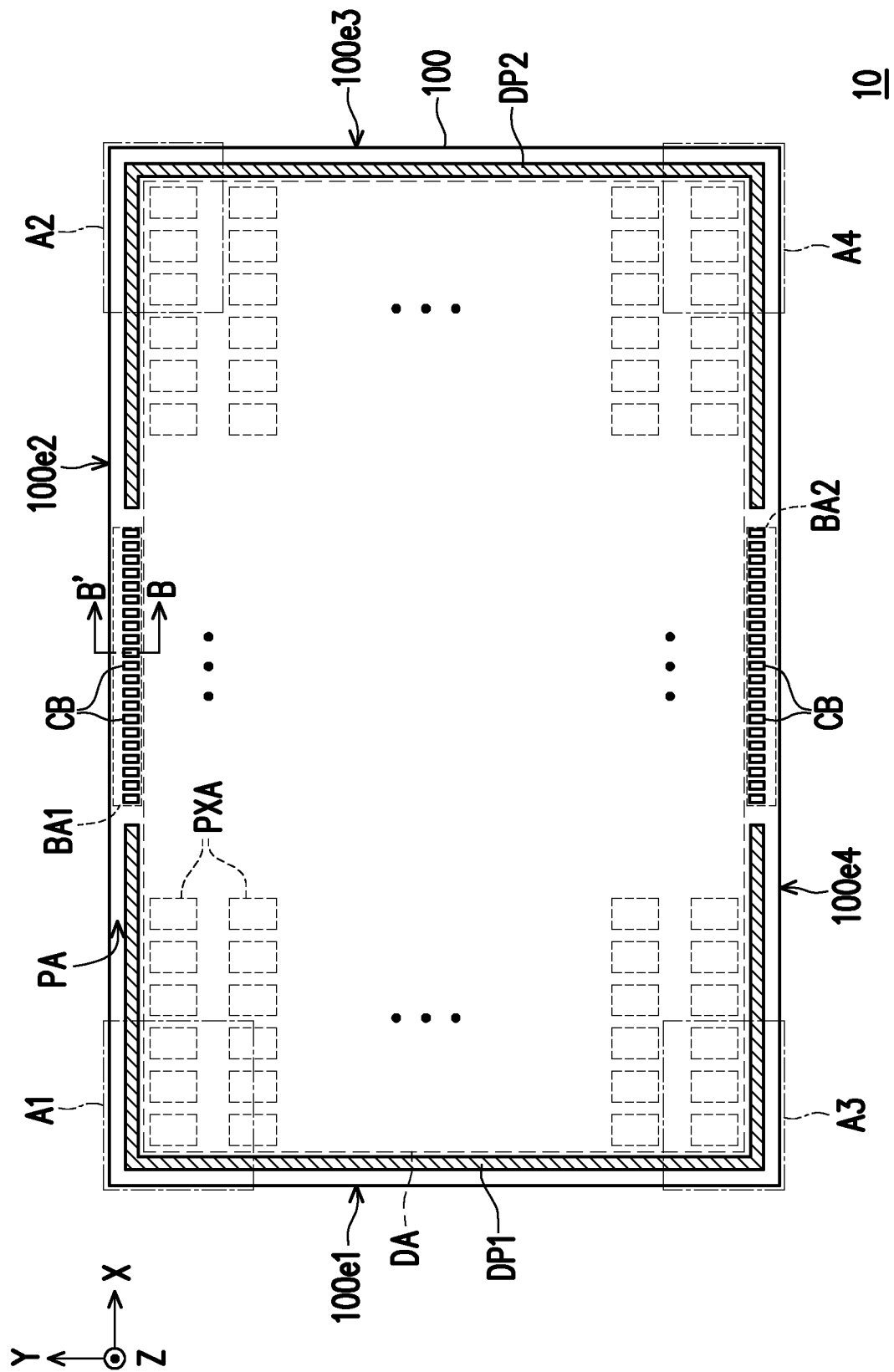
FIG. 1 is a schematic top view of a display panel according to a first embodiment of the disclosure.

The terms "about", "substantial" or "approximate" used herein include the related value and an average within an acceptable deviation range for a specific value determined by those skilled in the art, considering a discussed measurement and a specific number of errors related to the measurement (i.e., a limitation of a measuring system). For example, "about" may represent a range within one or a plurality of standard deviations of the related value, or within ±30%, ±20%, ±15%, ±10%, ±5%. In addition, an acceptable deviation range or standard deviation may be selected for the terms "about", "approximate", "essential", or "substantial" used in the specification based on measurement properties, cutting properties, or other properties without using one standard deviation for all properties.

In the drawings, the thickness of layers, films, panels, regions, etc., are exaggerated for clarity's sake. It will be understood that when a component such as a layer, a film, a region, or a substrate is referred to as being "on" or "connected to" another component, it may be directly on or connected to said another component, or intermediate components may also exist between them. Comparatively, when a component is referred to as being "directly on" or "directly connected" to another component, none other intermediate component exits between them. As used herein, the term "connection" may refer to physical and/or electrical connection. Furthermore, "electrical connection" of two components may cover a case where other components exist between the two components.

Reference will now be made in detail to the present preferred embodiments of the disclosure, examples of which are illustrated in the accompanying drawings. Wherever possible, the same reference numbers are used in the drawings and the description to refer to the same or like parts.

Figures 2A, 2B:
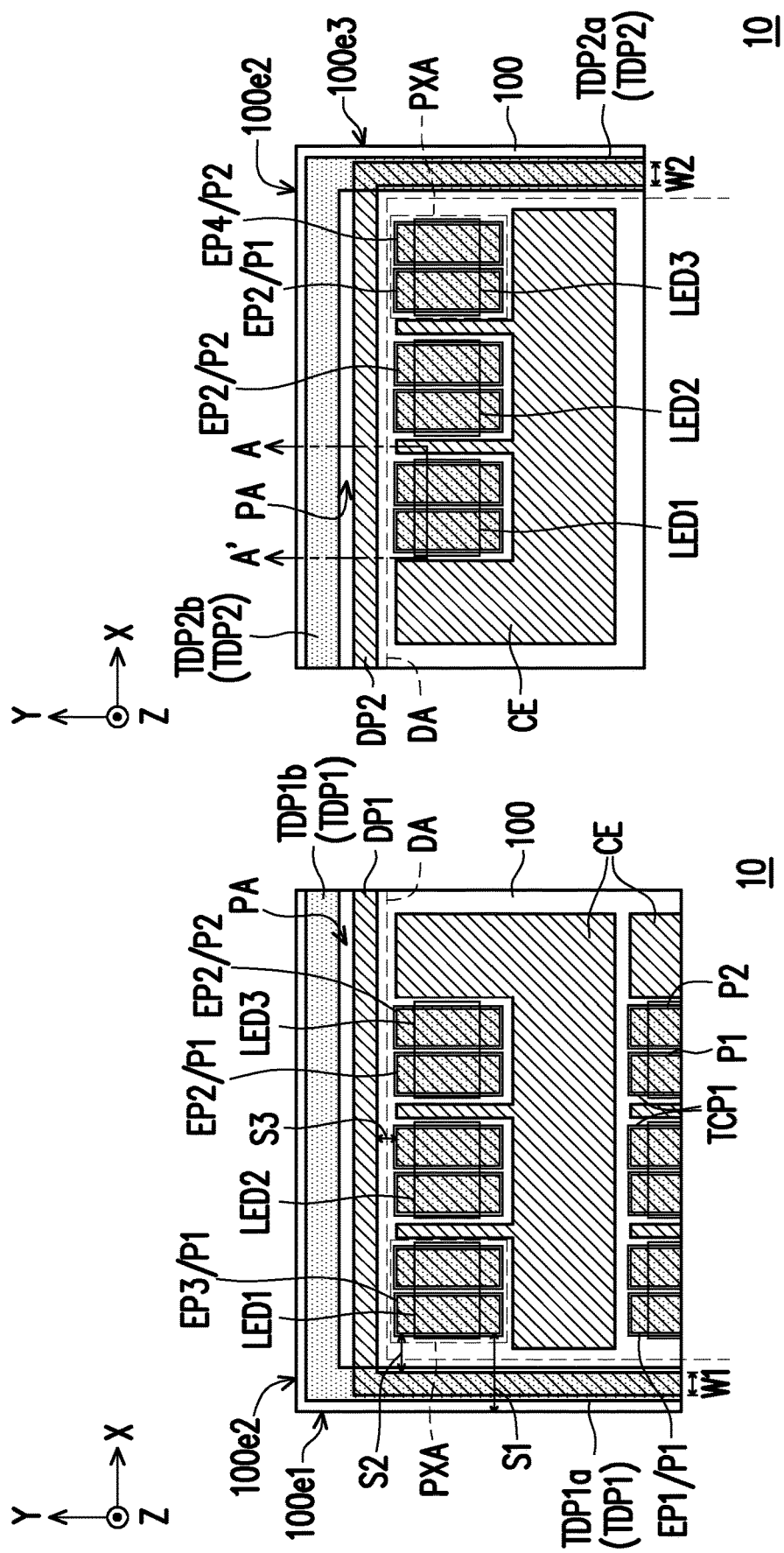
FIG. 2A to FIG. 2D are respectively schematic enlarged views of partial areas of the display panel of FIG. 1.

FIG. 1 is a schematic top view of a display panel according to a first embodiment of the disclosure. FIG. 2A to FIG. 2D are respectively schematic enlarged views of partial areas of the display panel of FIG. 1. FIG. 3 is a schematic cross-sectional view of the display panel of FIG. 1. FIG. 2A to FIG. 2D respectively correspond to an area A1, an area A2, an area A3 and an area A4 in FIG. 1, and FIG. 3 corresponds to section line A-A' of FIG. 2B and section line B-B' of FIG. 1.

Referring to FIG. 1 to FIG. 3, a display panel 10 has a display area DA and a peripheral area PA surrounding the display area DA, where the display area DA is provided with a plurality of pixel areas PXA, and the pixel areas PXA may be arranged into an array in the display area DA. For example, the pixel areas PXA may be respectively arranged in a plurality of rows and a plurality of columns along a direction X and a direction Y, but the disclosure is not limited thereto.

The display panel 10 includes a substrate 100 and at least two planarization layers, a plurality of pads and a plurality of light-emitting devices disposed on the substrate 100. The pads are disposed on the at least two planarization layers and are used for bonding the light-emitting devices. In the embodiment, the display panel 10 may include a plurality of first light-emitting devices LED1, a plurality of second light-emitting devices LED2 and a plurality of third light-emitting devices LED3. The pads may constitute a plurality of pad groups. These pad groups are respectively disposed in the plurality of pixel areas PXA, and each includes a first pad P1 and a second pad P2. The plurality of first pads P1 and the plurality of second pads P2 in the plurality of pixel areas PXA arranged along the direction X are alternately arranged along the direction X. For example, in the embodiment, three pixel areas PXA continuously arranged along the direction X may constitute a display unit of the display panel 10, and the three pixel areas PXA are respectively provided with light-emitting devices of different emitted light colors (for example, red, green and blue), such as the first light-emitting device LED1, the second light-emitting device LED2, and the third light-emitting device LED3.

The light-emitting device may include an epitaxial structure layer ES, a first electrode E1 and a second electrode E2. In the embodiment, the first electrode E1 and the second electrode E2 are disposed on a same side of the epitaxial structure layer ES, and are respectively electrically connected to a first type semiconductor layer (not shown) and a second type semiconductor layer (not shown) of the epitaxial structure layer ES. To be more specific, the light-emitting device of the embodiment is, for example, a flip-chip type light-emitting diode, and the first electrode E1 and the second electrode E2 thereof may be respectively electrically connected to the first pad P1 and the second pad P2, but the disclosure is not limited thereto. In other embodiments, the light-emitting device may also be a vertical type light-emitting diode.

Further, the display panel 10 may further include an active device T (as shown in FIG. 3), and the active device T is electrically connected to the pad (for example, the first pad P1). For example, a step of forming the active device T may include: sequentially forming a buffer layer 110, a semiconductor pattern SC, a gate insulating layer 115, a gate electrode GE, an interlayer insulating layer 120, and a source electrode SE and a drain electrode DE on the substrate 100, where the semiconductor pattern SC may have a channel region CH, a lightly doped source region LSR, a lightly doped drain region LDR, a source region SR and a drain region DR, and the source electrode SE and the drain electrode DE penetrate through the interlayer insulating layer 120 and the gate insulating layer 115, and are respectively electrically connected to the source region SR and the drain region DR of the semiconductor pattern SC.

In the embodiment, the gate electrode GE may be selectively disposed above the semiconductor pattern SC to form a top-gate thin film transistor, but the disclosure is not limited thereto. In other embodiments, the gate electrode GE may also be disposed under the semiconductor pattern SC to form a bottom-gate thin film transistor. On the other hand, a material of the semiconductor pattern SC is, for example, a poly-silicon material. Namely, the active device T is, for example, a low-temperature polycrystalline silicon thin film transistor (LIPS TFT). However, the disclosure is not limited thereto, and in other embodiments, the active device may also be an amorphous silicon TFT (a-Si TFT), a micro-Si TFT or a metal oxide transistor.

It should be noted that the buffer layer 110, the gate insulating layer 115, the gate electrode GE, the interlayer insulating layer 120, the source electrode SE and the drain electrode DE may be respectively implemented by any buffer layer, any gate insulating layer, any gate electrode, any interlayer insulating layer, any source electrode and any drain electrode that are used in the display panel and known to those with ordinary knowledge in the art, and the buffer layer 110, the gate insulating layer 115, the gate electrode GE, the interlayer insulating layer 120, the source electrode SE and the drain electrode DE may be formed by any method well-known to those skilled in the art, so that details thereof are not repeated.

Further, in order to increase a design flexibility of a driving circuit, in the display panel 10, in addition to a first conductive layer constituting the gate electrode GE and a second conductive layer constituting the source electrode SE and the drain electrode DE, a third conductive layer a fourth conductive layer and a fifth conductive layer may also be sequentially disposed above the active device T. Considering conductivity, these conductive layers are generally made of metal materials. However, the disclosure is not limited thereto, and these conductive layers may also be made of other conductive materials according to other embodiments. For example: alloys, nitrides of metal materials, oxides of metal materials, oxynitrides of metal materials, or laminated layers of metal materials and other conductive materials.

In the embodiment, the third conductive layer may include a conductive pattern CP1 and a transfer pattern TP1, the fourth conductive layer may include a conductive pattern CP2 and a transfer pattern TP2, and the fifth conductive layer may include a common electrode CE, the first pad P1 and the second pad P2, but the disclosure is not limited thereto. For example, the second pad P2 may be electrically connected to the drain electrode DE of the active device T through the transfer pattern TP1 and the transfer pattern TP2, and the conductive pattern CP1 and the conductive pattern CP2 may be respectively used as a power supply line and a connection line of the display panel 10, or signal lines of other functions, but the disclosure is not limited thereto.

On the other hand, a part of the pads (for example, the first pad P1 or the second pad P2) may be electrically connected to the common electrode CE. In the embodiment, each display unit may be provided with one common electrode CE, and the three first pads P1 in the three adjacently arranged pixel areas PXA may be electrically connected to the same common electrode CE, but the disclosure is not limited thereto. In other embodiments, the common electrodes CE of different display units may be structurally connected to each other to form an integrated conductive pattern, and all of the first pads P1 are electrically connected to the conductive pattern.

In the embodiment, a planarization layer 141 and an insulating layer 131 are provided between the second conductive layer (for example, the source electrode SE and the drain electrode DE) and the third conductive layer (for example, the transfer pattern TP1 and the conductive pattern CP1), and the transfer pattern TP1 penetrates through the planarization layer 141 and the insulating layer 131 and is electrically connected to the drain electrode DE of the active device T. A planarization layer 142 and an insulating layer 132 are disposed between the third conductive layer and the fourth conductive layer (for example, the transfer pattern TP2 and the conductive pattern CP2), and the transfer pattern TP2 penetrates through the planarization layer 142 and the insulating layer 132 and is electrically connected to the transfer pattern TP1. A planarization layer 143 and an insulating layer 133 are disposed between the fourth conductive layer and the fifth conductive layer (for example, the common electrode CE, the first pad P1 and the second pad P2), and the second pad P2 penetrates through the planarization layer 143 and the insulating layer 133 and is electrically connected to the transfer pattern TP2. For example, a thickness (for example, a thickness t1, a thickness t2, or a thickness t3) of each of the planarization layers along the direction Z may be greater than or equal to 2 micrometers (μm). More specifically, a total thickness of the planarization layers or at least two of the planarization layers is greater than or equal to 4 μm.

Further, the substrate 100 has a substrate edge 100e1, a substrate edge 100e2, a substrate edge 100e3, and a substrate edge 100e4. The substrate edge 100e1 and the substrate edge 100e3 are disposed opposite to each other along the direction X, and the substrate edge 100e2 and the substrate edge 100e4 are disposed opposite to each other along the direction Y. Particularly, in the embodiment, the pads closest to the substrate edge may be defined as edge pads.

Figures 2C, 2D:
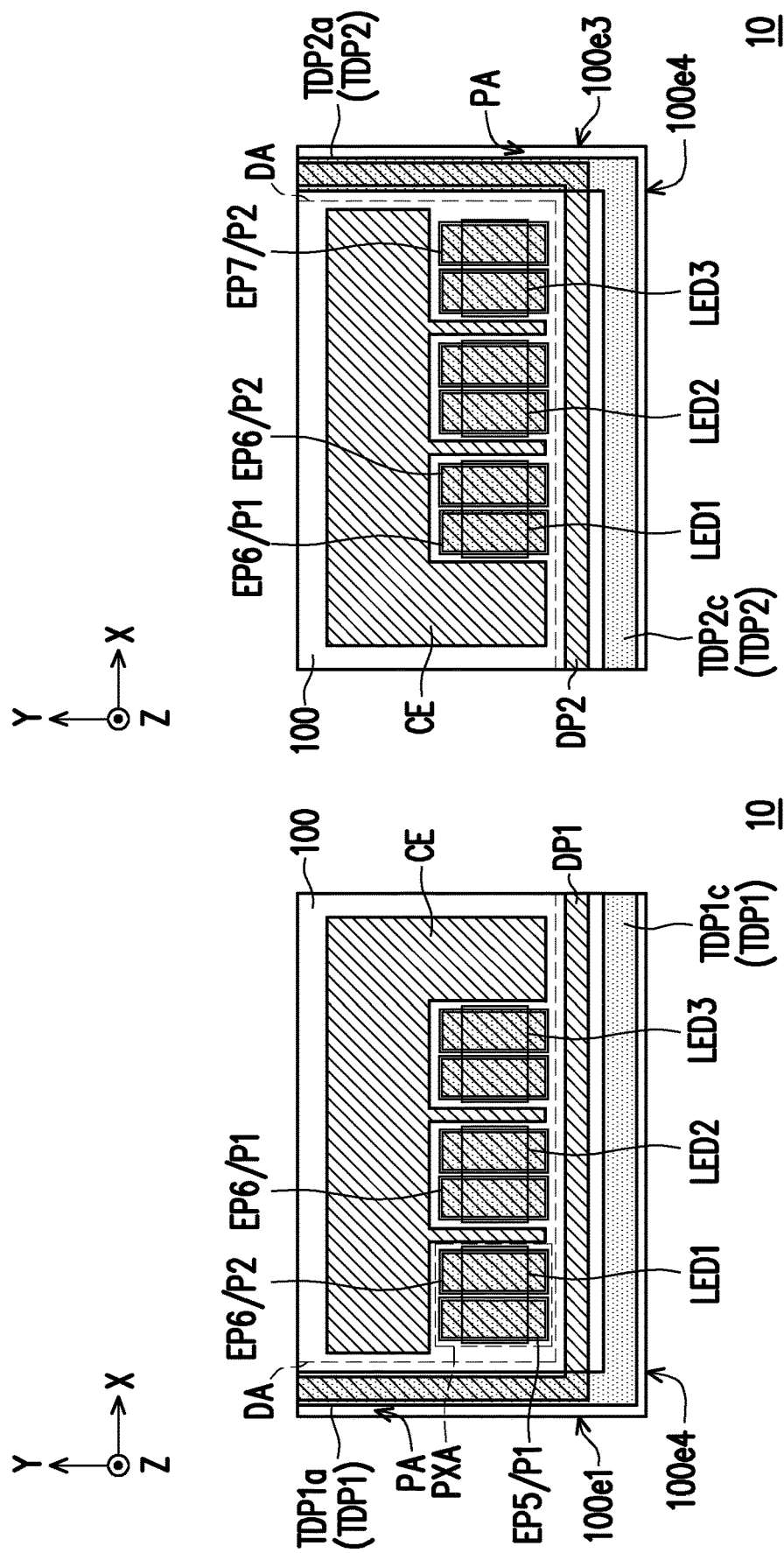
Figure 3:
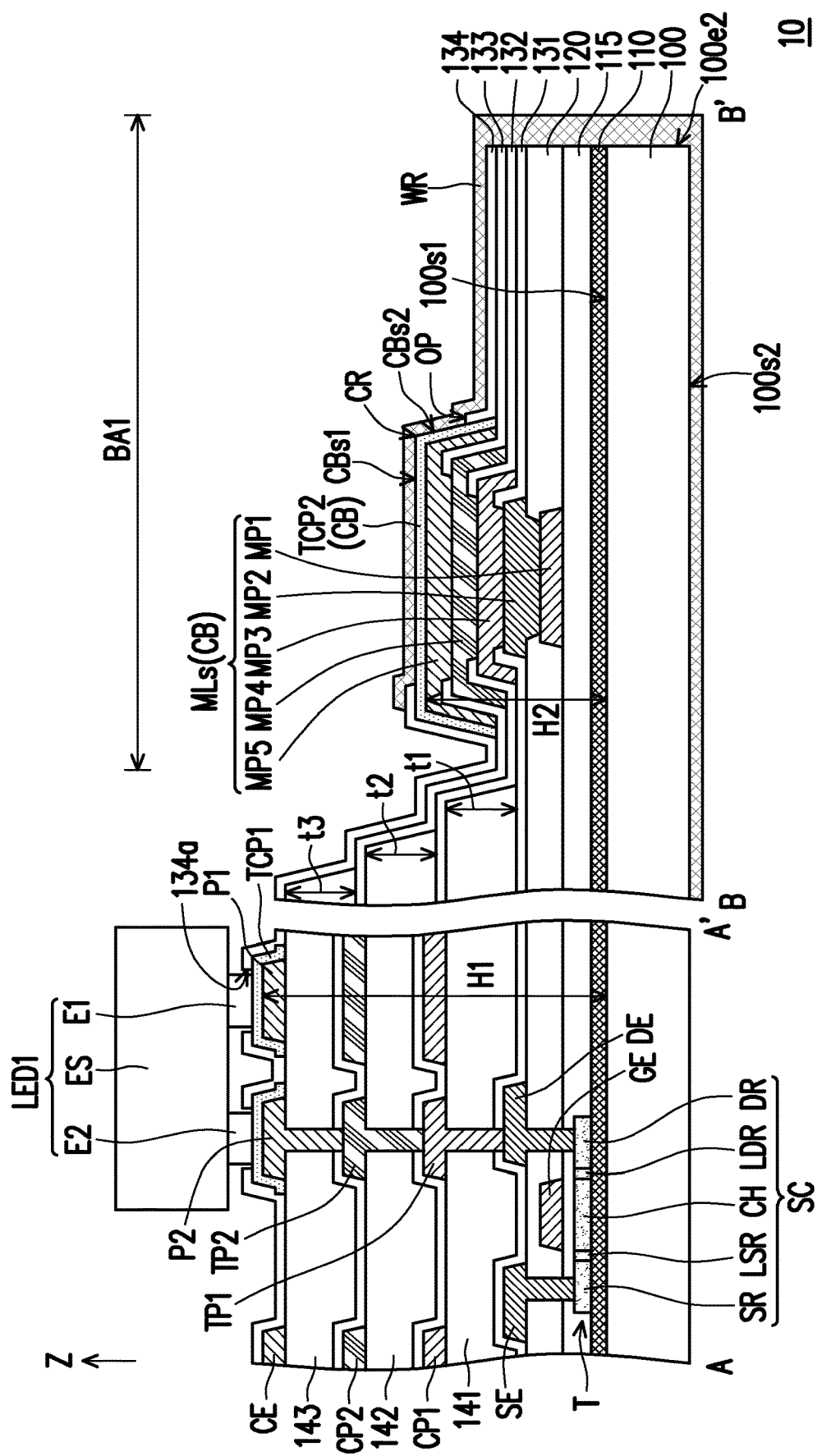
FIG. 3 is a schematic cross-sectional view of the display panel of FIG. 1.
Figures 4A, 4B:
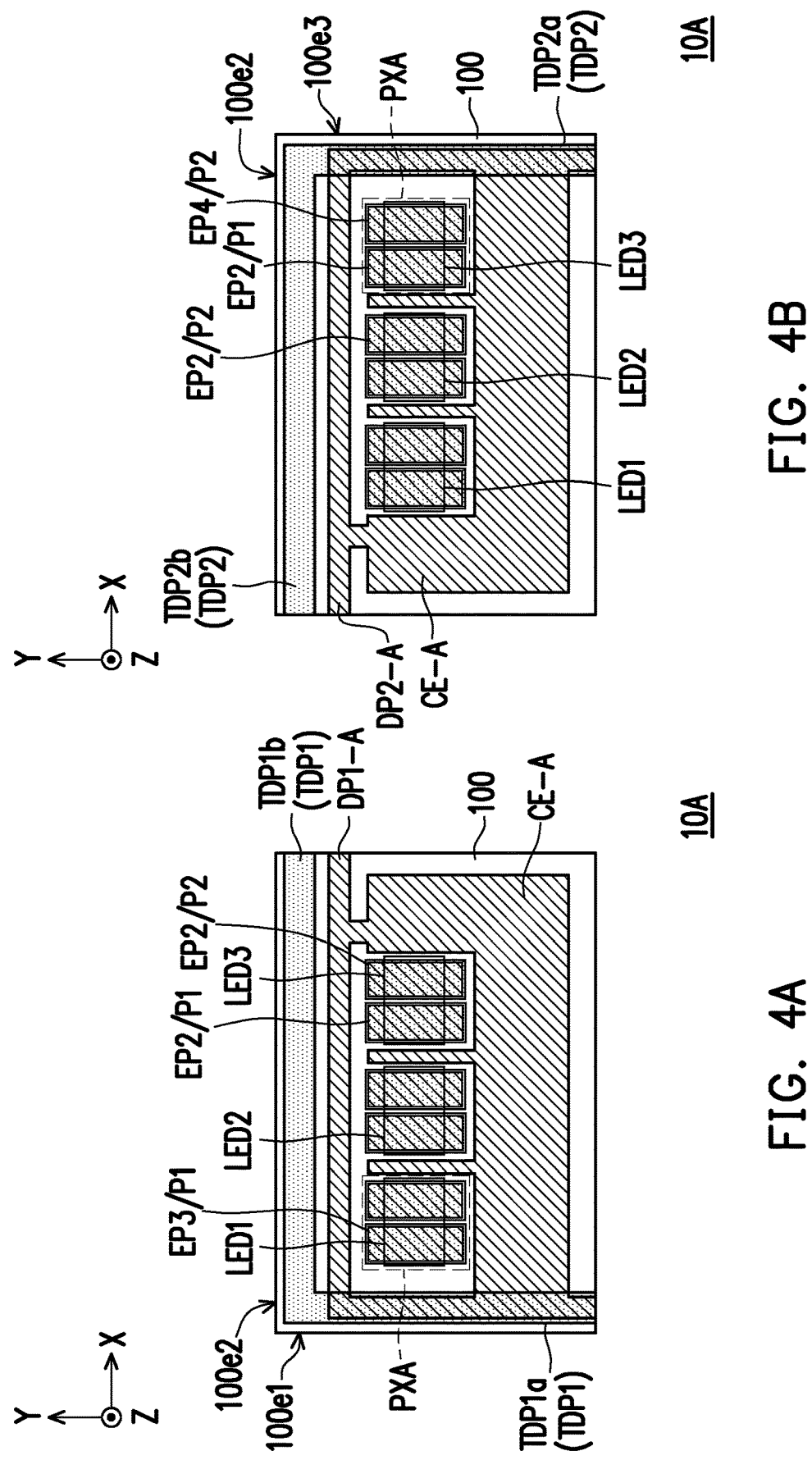
FIG. 4A to FIG. 4D are schematic top views of a display panel according to a second embodiment of the disclosure.
Figures 4C, 4D:
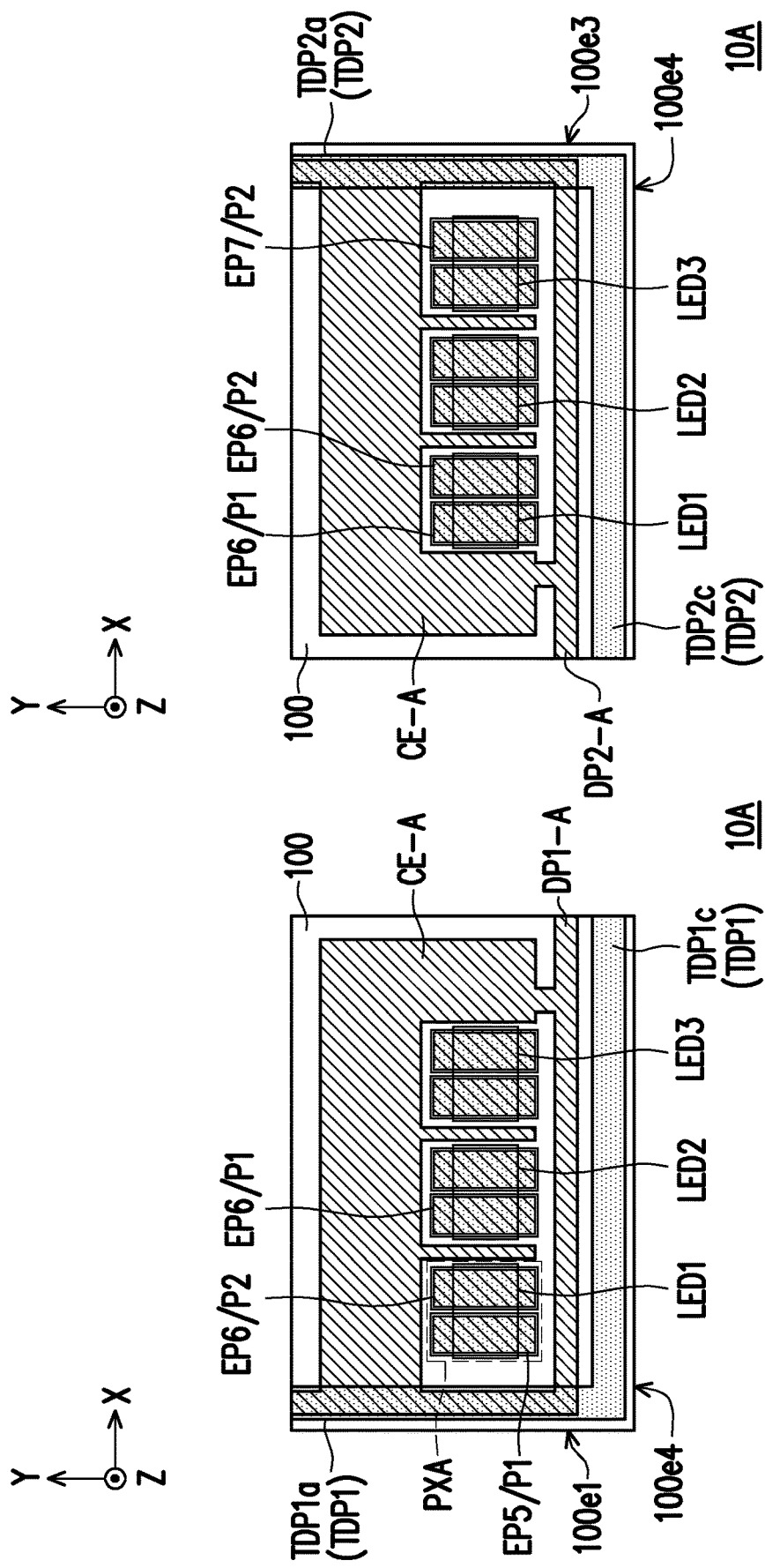
Figures 6A, 6B:
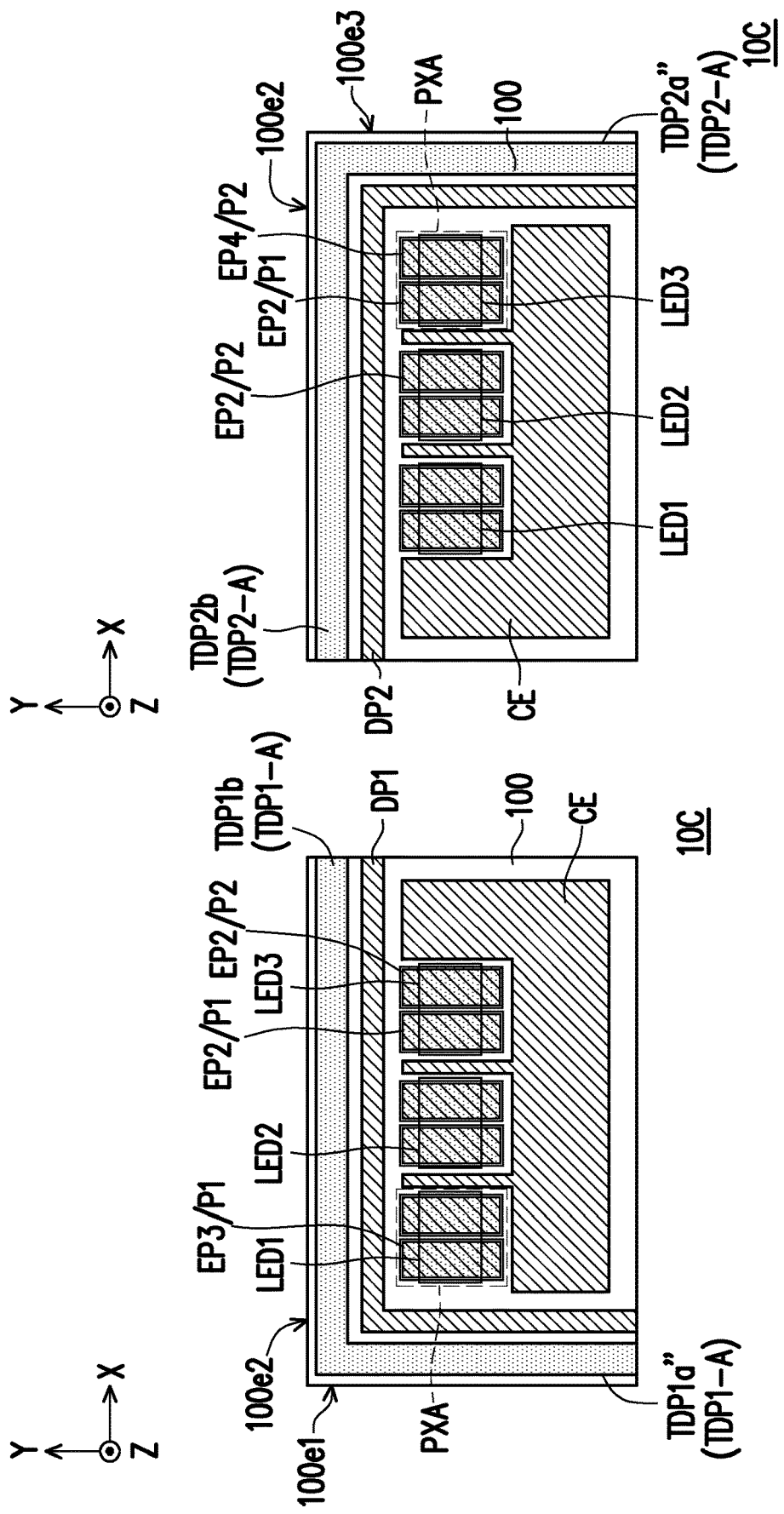
FIG. 6A to FIG. 6D are schematic top views of a display panel according to a fourth embodiment of the disclosure.
Figures 6C, 6D:
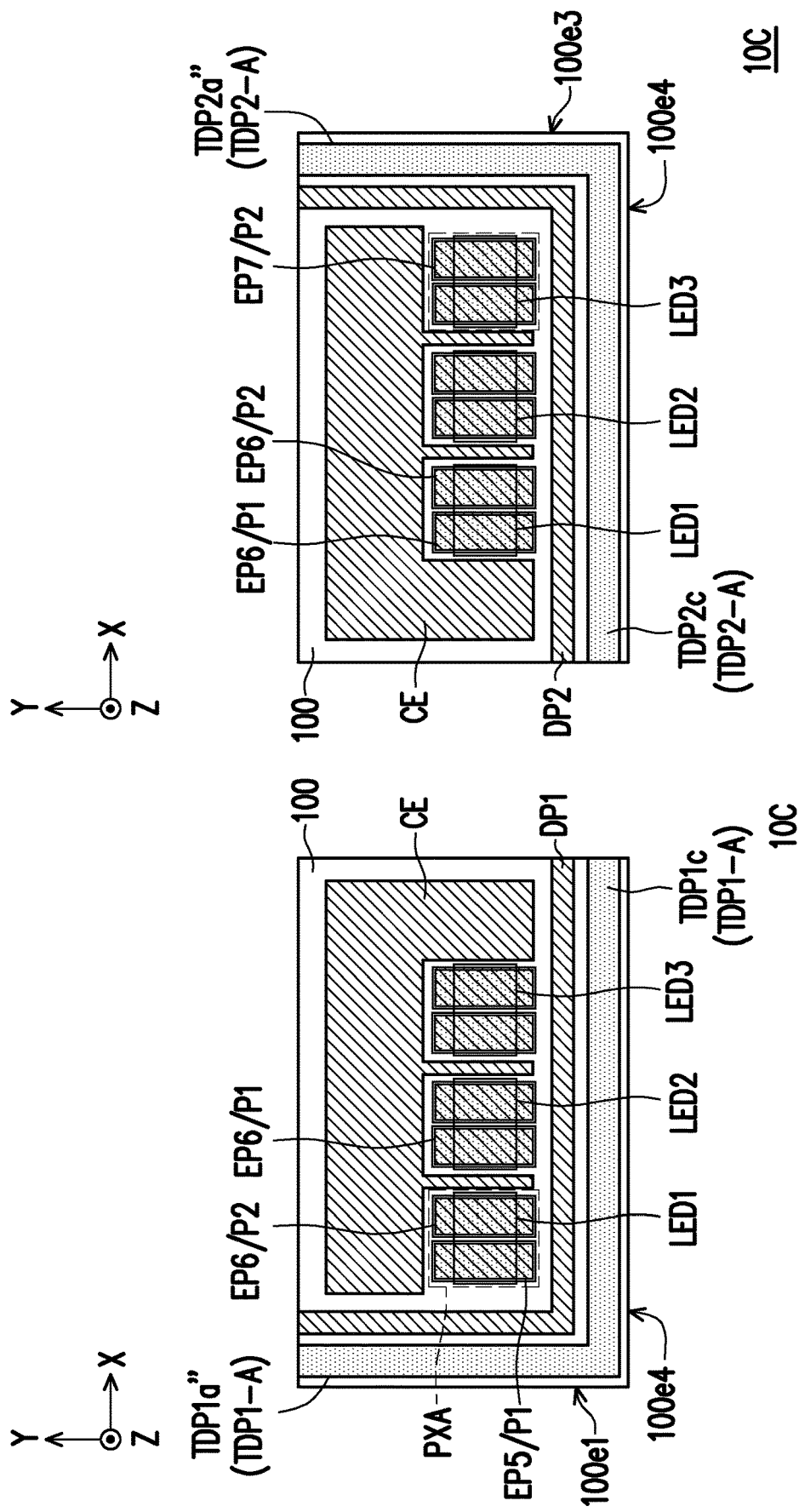

For example, the display panel 10 may include a plurality of edge pads EP1 closest to the substrate edge 100e1 (shown in FIG. 2A), a plurality of edge pads EP2 closest to the substrate edge 100e2 (shown in FIG. 2A and FIG. 2B), one edge pad EP3 closest to the substrate edge 100e1 and the substrate edge 100e2 (shown in FIG. 2A), one edge pad EP4 closest to the substrate edge 100e2 and the substrate edge 100e3 (shown in FIG. 2B), a plurality of edge pads closest to the substrate edge 100e3 (not shown), an edge pad EP5 closest to the substrate edge 100e1 and the substrate edge 100e4 (shown in FIG. 2C), a plurality of edge pads EP6 closest to the substrate edge 100e4 (shown in FIGS. 2C and 2D) and an edge pad EP7 closest to the substrate edge 100e3 and the substrate edge 100e4 (shown in FIG. 2D).

In the embodiment, a space S1 between the edge pad EP3 (or the edge pad EP1) and the substrate edge 100e1 along the direction X (or a space between the edge pad EP4 and the substrate edge 100e3 along the direction X) is between 0 μm and 200 μm. More specifically, the display panel 10 of the embodiment may have a slim border design. Therefore, the spaces between the edges of the aforementioned plurality of planarization layers and the edge pads may be relatively small. During the patterning process of the pads, a part of a photoresist material used to fabricate a photoresist pattern is easy to lose at the edges of these planarization layers, resulting in defects in the photoresist pattern formed near the edge of the planarization layer 143 and it is unable to correctly define the above edge pads.

In order to solve the above problems, the display panel 10 further includes at least one dummy pattern disposed on the planarization layers and located in the peripheral area PA. In the embodiment, the display panel 10 may include a dummy pattern DP1 and a dummy pattern DP2, and the two dummy patterns are separated by two side bonding areas BA1, BA2 (as shown in FIG. 1). Particularly, the dummy patterns are disposed in the peripheral area PA between the abovementioned edge pads and the adjacent substrate edges.

For example, the dummy pattern DP1 disposed in the peripheral area PA may extend between the edge pads EP1 and the substrate edge 100e1 (as shown in FIG. 2A and FIG. 2C), and extend between a part of the edge pads EP2 and the substrate edge 100e2 (as shown in FIG. 2A) and between a part of the edge pads EP6 and the substrate edge 100e4 (as shown in FIG. 2C) in a bending manner, while the dummy pattern DP2 disposed in the peripheral area PA may extend between the edge pads (not shown) and the substrate edge 100e2, and extend between another part of the edge pads EP2 and the substrate edge 100e2 (as shown in FIG. 2B) and between another part of the edge pads EP6 and the substrate edge 100e4 (as shown in FIG. 2D) in the bending manner, but the disclosure is not limited thereto. A width W1 of the dummy pattern DP1 along the direction X and a width W2 of the dummy pattern DP2 along the direction X are greater than or equal to 5 μm.

In the embodiment, the dummy pattern, the pads and the common electrode CE may be selectively a same film layer. The shortest space between the dummy pattern and the adjacent edge pads is less than or equal to 30 μm. For example, in the embodiment, a space S2 between the dummy pattern DPl and the edge pad EP3 (or the edge pad EP1) along the direction X and a space S3 between the dummy pattern DP1 and the edge pad EP2 along the direction Y are greater than 0 μm and less than or equal to 30 μm, but the disclosure is not limited thereto. In other embodiments, the dummy pattern, the common electrode CE and a part of the edge pads may also be formed integrally, for example, the dummy pattern and a part of the edge pads may also be formed by two parts extending from the common electrode CE. Namely, the space between the dummy pattern and a part of the edge pads may also be 0 μm.

Since the dummy patterns are provided between the edge pads and the substrate edges, distances between the edges of the aforementioned plurality of planarization layers and the edge pads are increased, thereby avoiding loss of the photoresist material at the edges of the planarization layers during the patterning process of the pads. In other words, a yield of the patterning process of the edge pads may be effectively improved.

Further, the plurality of pads may also be selectively covered by a plurality of transparent conductive patterns TCP1. The transparent conductive patterns TCP1 may respectively wrap the pads to achieve an effect of protection. Similarly, in order to avoid that the transparent conductive pattern TCP1 cannot be correctly defined due to the loss of the photoresist material during the patterning process, the display panel 10 may further include a transparent dummy pattern TDP1 and a transparent dummy pattern TDP2. In the embodiment, the transparent dummy patterns and the transparent conductive pattern TCP1 may be of a same transparent conductive layer, and a material of the transparent conductive layer may include metal oxides, such as indium tin oxide, indium zinc oxide, aluminum tin oxide, aluminum zinc oxide, or other suitable oxides, or a laminated layer of at least two of the above oxides.

In detail, the transparent dummy pattern TDP1 has a first portion TDP1a extending between the edge pads EP1 and the substrate edge 100e1, a second portion TDP1b extending between the edge pads EP2 and the substrate edge 100e2, and a third portion TDP1c extending between the edge pads EP6 and the substrate edge 100e4 (as shown in FIG. 2A and FIG. 2C). Similarly, the transparent dummy pattern TDP2 has a first portion TDP2a extending between the edge pad EP3 and the substrate edge 100e2, a second portion TDP2b extending between the edge pads EP2 and the substrate edge 100e2, and a third portion TDP2c extending between the edge pads EP6 and the substrate edge 100e4 (as shown in FIG. 2B and FIG. 2D).

It should be noted that since there is no insulating layer between the fifth conductive layer and the above-mentioned transparent conductive layer, in order to meet different electrical requirements, in some embodiments, the transparent dummy pattern may be partially overlapped with the dummy pattern for contact conduction. For example, in the embodiment, the first portion TDP1a of the transparent dummy pattern TDP1 is overlapped with the dummy pattern DP1 along the direction Z, while the second portion TDP1b and the third portion TDP1c are not overlapped with the dummy pattern DP1 along the direction Z. Similarly, the first portion TDP2a of the transparent dummy pattern TDP2 is overlapped with the dummy pattern DP2 along the direction Z, while the second portion TDP2b and the third portion TDP2c are not overlapped with the dummy pattern DP2 along the direction Z.

Further, in the embodiment, in the display panel 10, the two side bonding areas BA1, BA2 are disposed in two parts of the peripheral area PA adjacent to the substrate edge 100e2 and the substrate edge 100e4. Since the aforementioned plurality of planarization layers are not overlapped with the side bonding areas along the direction Z, neither the dummy pattern DP1 nor the dummy pattern DP2 of the embodiment extends into the two side bonding areas BA1 and BA2. Namely, none of the dummy patterns is overlapped with any side bonding area.

For example, in the side bonding area BA1 and the side bonding area BA2, the display panel 10 may be provided with a plurality of conductive bumps CB. In the embodiment, the conductive bumps CB may have a metal laminated structure MLs and a transparent conductive pattern TCP2 covering the metal laminated structure MLs, where the transparent conductive pattern TCP2 and the transparent conductive pattern TCP1 covering the pad may be of a same film layer.

The metal laminated structure MLs is, for example, a laminated structure of a first metal pattern MP1, a second metal pattern MP2, a third metal pattern MP3, a fourth metal pattern MP4 and a fifth metal pattern MP5. For example, the first metal pattern MP1 and the gate electrode GE may be of a same film layer, the second metal pattern MP2, the source electrode SE and the drain electrode DE may be of a same film layer, the third metal pattern MP3, the transfer pattern TP1 and the conductive pattern CP1 may be of a same film layer, the fourth metal pattern MP4, the transfer pattern TP2 and the conductive pattern CP2 may be of a same film layer, and the fifth metal pattern MP5, the common electrode CE, the first pad P1 and the second pad P2 may be of a same film layer. The second metal pattern MP2 penetrates through the interlayer insulating layer 120 to be electrically connected to the first metal pattern MP1. The third metal pattern MP3 penetrates through the insulating layer 131 to be electrically connected to the second metal pattern MP2. The fourth metal pattern MP4 penetrates through the insulating layer 132 to be electrically connected to the third metal pattern MP3. The fifth metal pattern MP5 penetrates through the insulating layer 133 to be electrically connected to the fourth metal pattern MP4.

Particularly, since the aforementioned plurality of planarization layers (for example, the planarization layer 141, the planarization layer 142 and the planarization layer 143) do not extend to the side bonding area BA1 (or the side bonding area BA2), during the patterning process of the fifth metal pattern MP5 or the fourth metal pattern MP4, the photoresist material will not be lost due to a large terrain level difference. Namely, the metal patterns may be correctly defined in the side bonding areas where the aforementioned plurality of planarization layers are not provided. According to another point of view, a maximum height (i.e., a first height H1) is present between the transparent conductive pattern TCP1 covering the pads and a first surface 100s1 of the substrate 100 along the direction Z, and another maximum height (i.e., a second height H2) is present between the transparent conductive pattern TCP2 covering the metal laminated structure MLs and the first surface 100s1 of the substrate 100 along the direction Z, where the second height H2 is less than the first height H1.

The display panel 10 further includes a plurality of connecting wires WR respectively electrically connected to the conductive bumps CB. The substrate 100 has the first surface 100s1 and a second surface 100s2 which are connected to the substrate edges and are opposite to each other, and the connecting wires WR extend respectively on the first surface 100s1, the substrate edge 100e2 (or the substrate edge 100e4) and the second surface 100s2. More specifically, the connecting wires WR may extend from one side of the first surface 100s1 of the substrate 100 to the other side of the second surface 100s2 of the substrate 100 through the substrate edge in a bending manner, so as to be electrically connected to a control chip or connect wires of different layers to the control chip in series.

In the embodiment, the plurality of pads and the plurality of conductive bumps CB are further covered with an insulating layer 134. The insulating layer 134 has a plurality of openings 134a and a plurality of openings OP. The plurality of light-emitting devices are electrically connected to the plurality of pads through the openings 134a. The plurality of connecting wires WR are respectively electrically connected to the plurality of conductive bumps CB through the openings OP. For example, the above-mentioned connecting wires WR are formed by sputtering, and a target material is disposed on one side of the substrate edge 100e2 (or the substrate edge 100e4) of the substrate 100, but the disclosure is not limited thereto. Namely, in a sputtering process, the target material is placed on one side of the substrate edge adjacent to the side bonding area, and sputtering is performed in a direction toward the substrate edge.

In the embodiment, the conductive bump CB has a surface CBs1 facing away from the substrate 100 and a side surface CBs2 facing the substrate edge 100e2, and the side surface CBs2 is connected to the surface CBs1 to form a corner CR. Before performing the sputtering process of the connecting wires WR, the opening OP of the insulating layer 134 exposes the corner CR, a part of the surface CBs1 and a part of the side surface CBs2 of the conductive bump CB. Accordingly, the formed connecting wires WR may be in direct contact with the corner CR and a part of the side surface CBs2 of the conductive bump CB to ensure the electrical connection between the connecting wires WR and the conductive bump CB.

Other embodiments are provided below to describe the disclosure in detail, where the same reference numbers denote the same or like components, and descriptions of the same technical contents are omitted. Reference may be made to the aforementioned embodiments for descriptions of the omitted parts, and detailed descriptions thereof are not repeated in the following embodiment.

FIG. 4A to FIG. 4D are schematic top views of a display panel according to a second embodiment of the disclosure. It is particularly noted that FIG. 4A to FIG. 4D are respectively schematic enlarged views of partial areas (for example, the area A1 to the area A4 of the display panel 10 in FIG. 1) corresponding to a upper left corner, an upper right corner, a lower left corner and a lower right corner of a display panel 10A. Referring to FIG. 4A to FIG. 4D, a difference between the display panel 10A of the embodiment and the display panel 10 of FIG. 2A to FIG. 2D is that a dummy pattern DP1-A (or a dummy pattern DP2-A) and a common electrode CE-A of the display panel 10A may be structurally connected. Namely, the dummy pattern DP1-A and the common electrode CE-A may be integrally formed.

FIG. 5A and FIG. 5B are schematic top views of a display panel according to a third embodiment of the disclosure. Specifically, FIG. 5A and FIG. 5B are respectively schematic enlarged views of partial areas (for example, the area A3 and the area A4 of the display panel 10 in FIG. 1) corresponding to a lower left corner and a lower right corner of a display panel 10B.

Referring to FIG. 5A and FIG. 5B, a difference between the display panel 10B of the embodiment and the display panel 10A of FIG. 4A to FIG. 4D is that the display panel 10B may selectively include a dummy pattern DP1-2 and a dummy pattern DP2-2. For example, in the embodiment, the dummy pattern DP1-2 may be disposed between the dummy pattern DP1-A and the substrate edge 100e4, and an extending direction thereof is parallel to an extending direction of the dummy pattern DP1-A. Similarly, the dummy pattern DP2-2 may be disposed between the dummy pattern DP2-A and the substrate edge 100e4, and an extending direction thereof is parallel to that of the dummy pattern DP2-A.

In the embodiment, the dummy pattern DP1-A and the dummy pattern DP1-2 may be of a same film layer and are electrically connected to each other. Similarly, the dummy pattern DP2-2 and the dummy pattern DP2-A may be of a same film layer and are electrically connected to each other. However, the disclosure is not limited thereto. According to other embodiments that are not shown, the dummy pattern DP1-2 and the dummy pattern DP1-A may also be electrically independent from each other without being connected with each other, and the dummy pattern DP2-2 and the dummy pattern DP2-A may also be electrically independent from each other without being connected with each other.

Since the dummy pattern DP1-A is connected to the common electrode CE, if a situation of disconnection or incomplete definition occurs during the fabrication process, an overall electrical property of the common electrode CE and the dummy pattern DP1-A will be affected. Therefore, through the configuration of the other dummy pattern DP1-2 and the dummy pattern DP2-2, the edges of the plurality of planarization layers may be kept away from predefined areas of the dummy pattern DP1-A and the dummy pattern DP2-A, so as to avoid the problem that the definition of the dummy pattern DP1-A and the dummy pattern DP2-A is incomplete or broken due to the loss of a part of the photoresist material through the edge of the planarization layer during the patterning process, which helps to ensure the operation electricity of the display panel 10B.

FIG. 6A to FIG. 6D are schematic top views of a display panel according to a fourth embodiment of the disclosure. FIG. 7A to FIG. 7D are schematic top views of a display panel according to a fifth embodiment of the disclosure. It is particularly noted that FIG. 6A to FIG. 6D (or FIG. 7A to FIG. 7D) are respectively schematic enlarged views of partial areas (for example, the area A1 to the area A4 of the display panel 10 in FIG. 1) corresponding to a upper left corner, an upper right corner, a lower left corner and a lower right corner of a display panel 10C.

Referring to FIG. 6A to FIG. 6D, a difference between the display panel 10C of the embodiment and the display panel 10 of FIG. 2A to FIG. 2D lies in a different overlapping relationship between the transparent dummy pattern and the dummy pattern. For example, in the embodiment, a transparent dummy pattern TDP1-A of the display panel 10C is not overlapped with the dummy pattern DP1 along the direction Z, and a transparent dummy pattern TDP2-A is not overlapped with the dummy pattern DP2 along the direction Z. Namely, compared to the display panel 10 of FIG. 2A to FIG. 2D, a first portion TDP1$a''$ of the transparent dummy pattern TDP1-A of the display panel 10C is not overlapped with the dummy pattern DP1, and a first portion TDP2$a''$ of the transparent dummy pattern TDP2-A is not overlapped with the dummy pattern DP2.

Figures 7A, 7B:
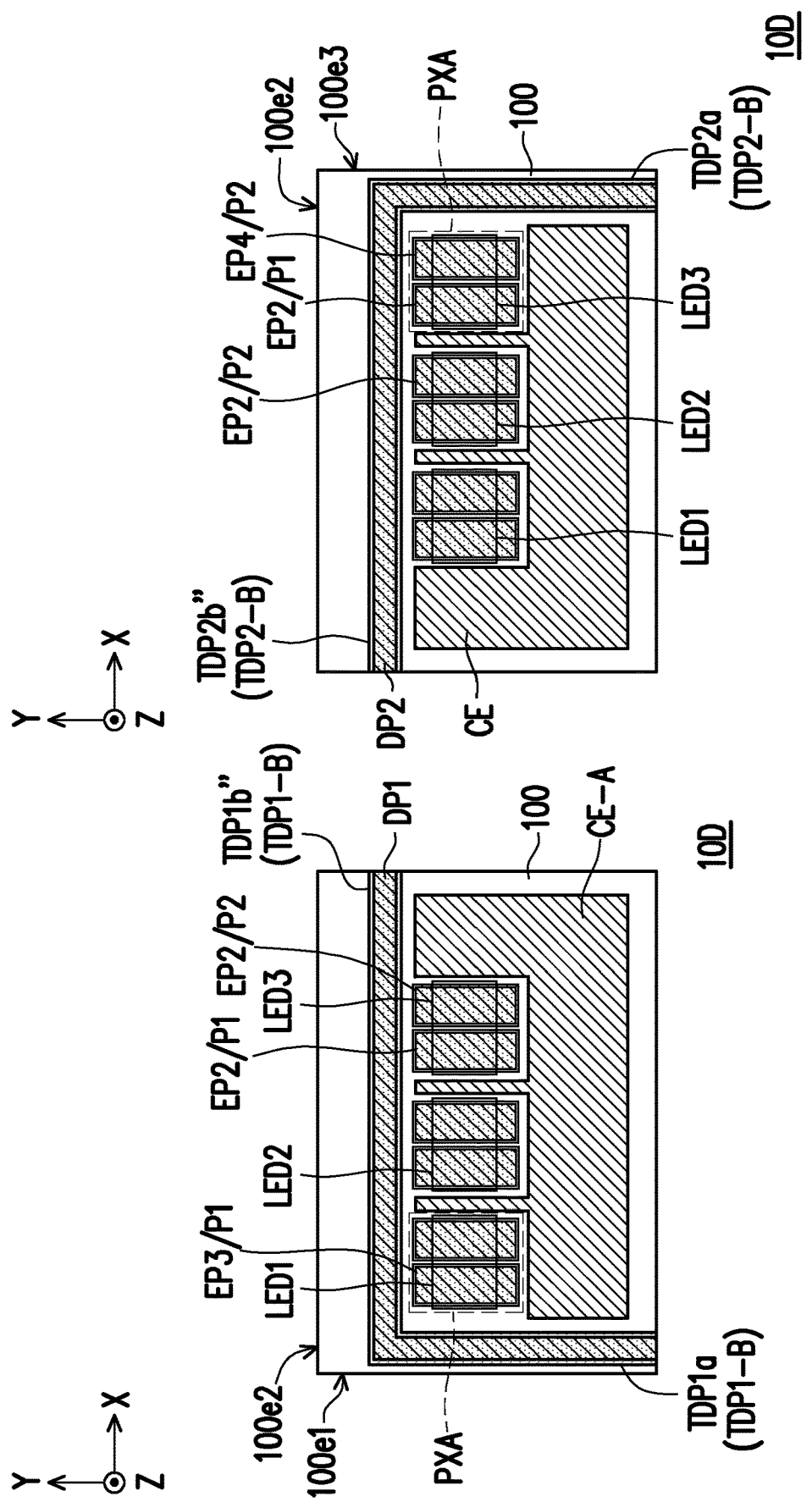

However, the disclosure is not limited thereto. In another embodiment, the dummy pattern DP1 of a display panel 10D may be completely overlapped with a transparent dummy pattern TDP1-B along the direction Z, and the dummy pattern DP2 may be completely overlapped with a transparent dummy pattern TDP2-B along the direction Z (as shown in FIG. 7A-FIG. 7B). Namely, compared with the display panel 10 of FIG. 2A to FIG. 2D, a second portion TDP1$b''$ and a third portion TDP1$c''$ of the transparent dummy pattern TDP1-B of the display panel 10D may also be overlapped with the dummy pattern DP1, while a second portion TDP2$b''$ and a third portion TDP2$c''$ of the transparent dummy pattern TDP2-B may also be overlapped with the dummy pattern DP2 to meet different electrical requirements.

Figure 8:
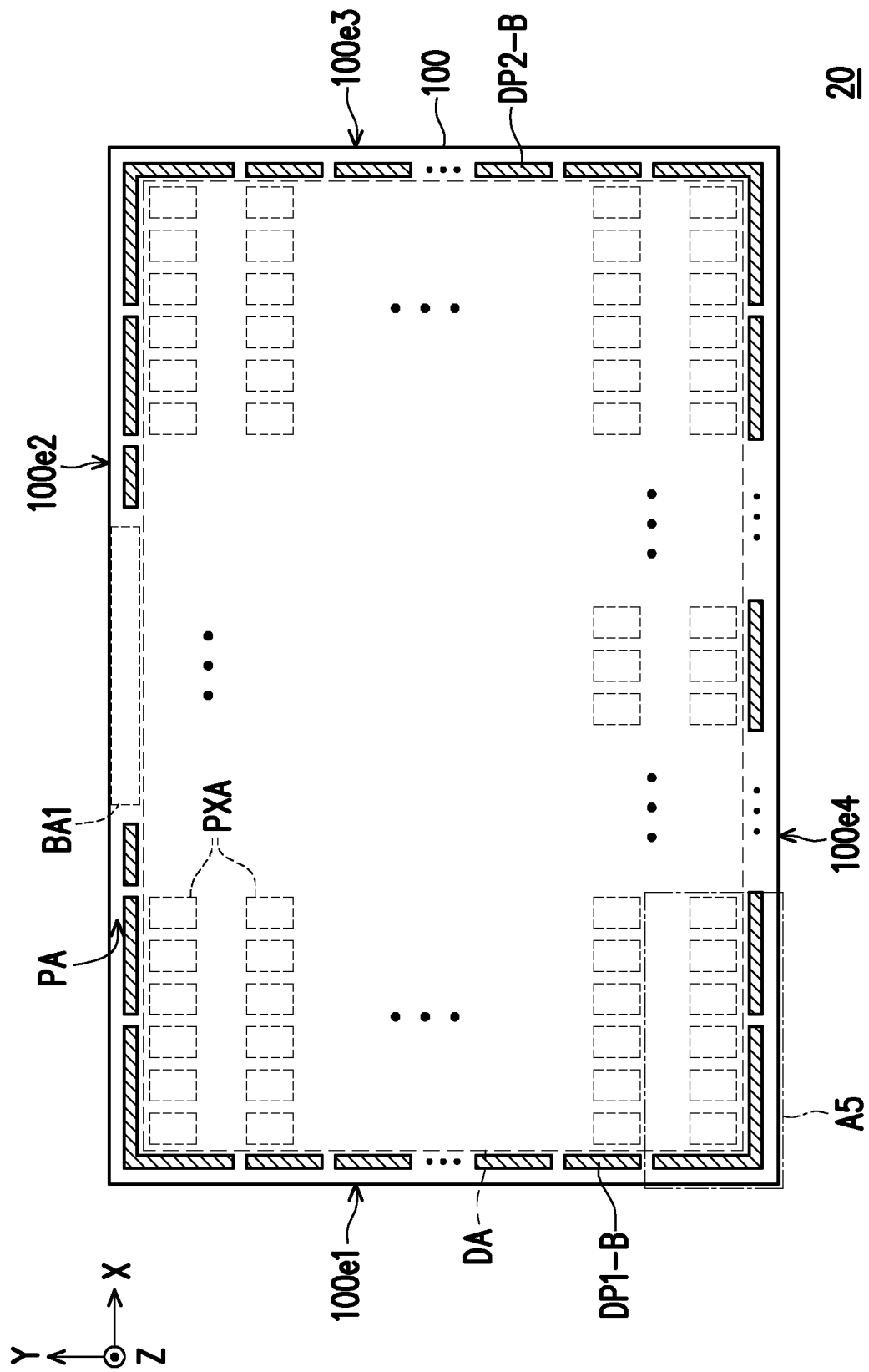
FIG. 8 is a schematic top view of a display panel according to a sixth embodiment of the disclosure.
Figure 9:
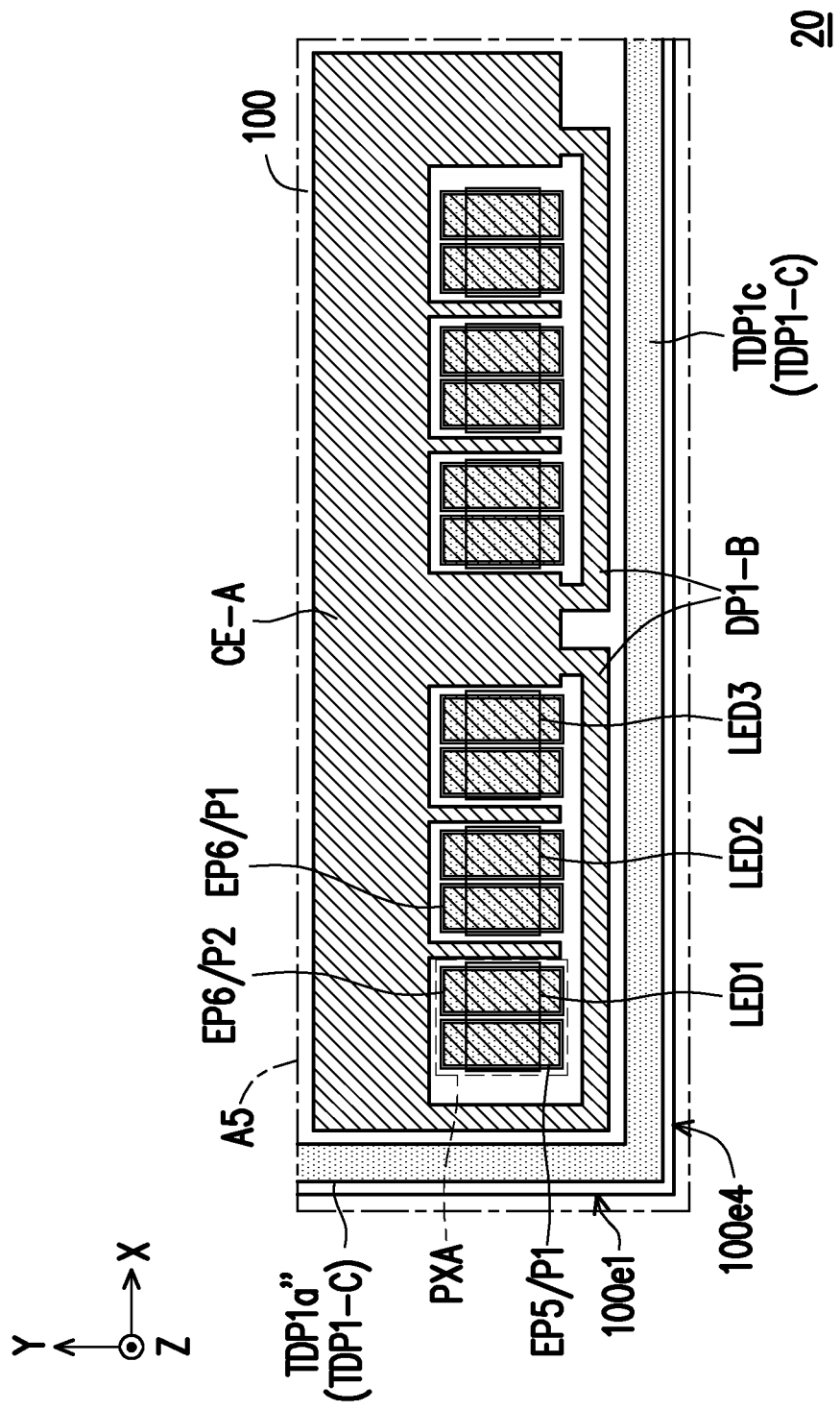
FIG. 9 is an enlarged schematic view of a partial area of the display panel of FIG. 8.

FIG. 8 is a schematic top view of a display panel according to a sixth embodiment of the disclosure. FIG. 9 is an enlarged schematic view of a partial area A5 of the display panel of FIG. 8. For clarity's sake, FIG. 8 only illustrates the substrate 100, the pixel area PXA, a dummy pattern DP1-B and a dummy pattern DP2-B of FIG. 9. Referring to FIG. 8 and FIG. 9, a main difference between the display panel 20 of the embodiment and the display panel 10 of FIG. 1 is that configurations of the dummy patterns are different.

In the embodiment, the dummy pattern DP1-B (or the dummy pattern DP2-B) of the display panel 20 does not extend continuously between the edge pads and the substrate edge, but is divided into a plurality of extension sections that are structurally separated from each other. These extension sections are respectively set corresponding to a plurality of display units. FIG. 9 shows the partial area A5 of the display panel 20 that covers two display units. The peripheries of the two display units are respectively configured with two extension sections of the dummy pattern DP1-B, and the two extension sections are respectively connected to the common electrode CE of different display units.

On the other hand, in order to meet different electrical requirements, the transparent dummy pattern of the display panel 20 may not be overlapped with the dummy pattern at all along the direction Z. For example, compared to the display panel 10 of FIG. 2C, the first portion TDP1a" of a transparent dummy pattern TDP1-C is not overlapped with the dummy pattern DP1-B along the direction Z.

Particularly, in the display panel 20 of the embodiment, since the side bonding area BA1 is only disposed in the peripheral area PA on the side of the substrate edge 100e2, the dummy pattern may also be provided in the peripheral area PA opposite to the side bonding area BA1 on the side of the substrate edge 100e4. Namely, the part of the peripheral area PA of the display panel may be provided with the dummy pattern and the transparent dummy pattern as long as no side bonding area is configured in such part.

Figure 10:
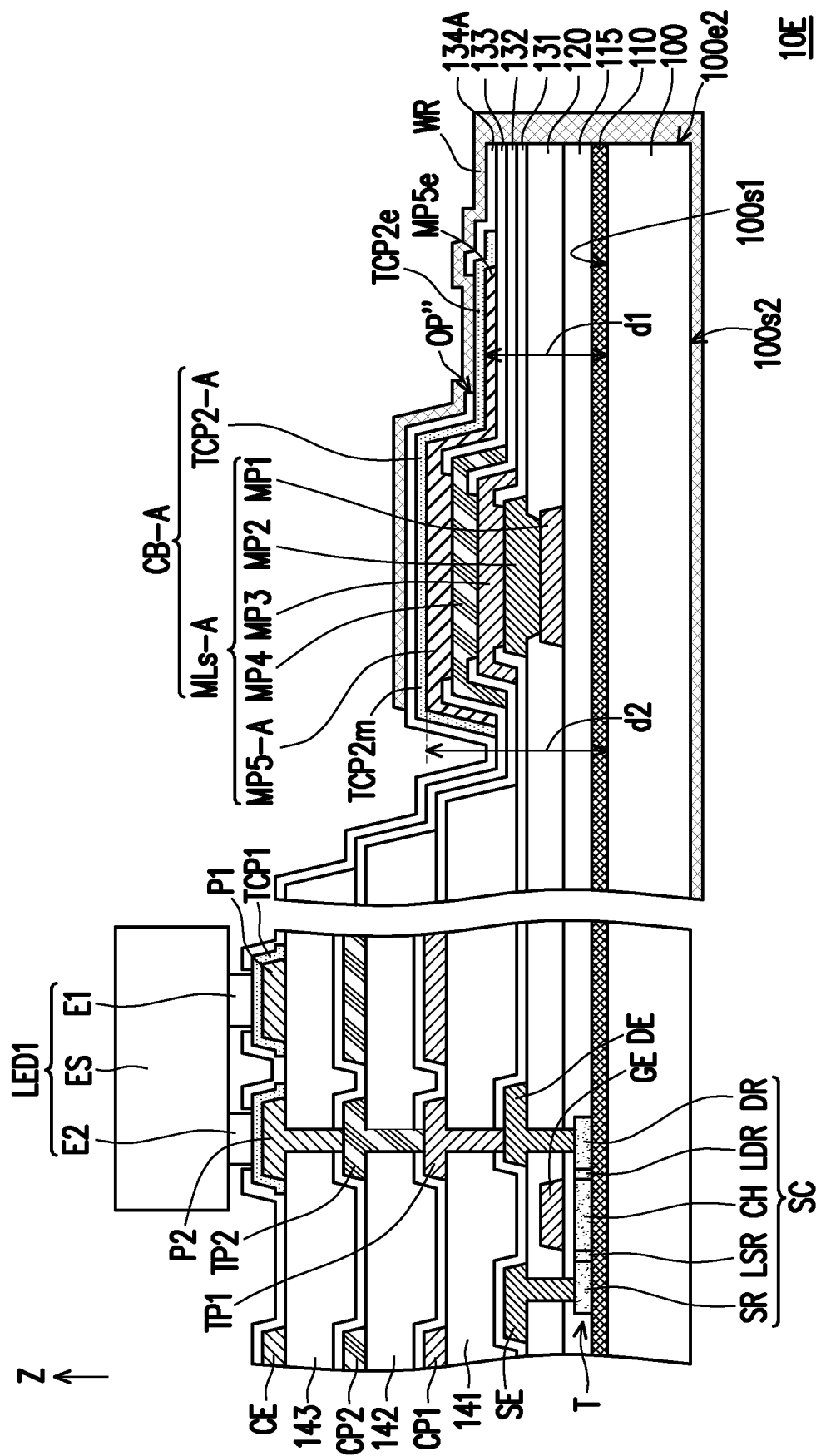
FIG. 10 is a schematic cross-sectional view of a display panel according to a seventh embodiment of the disclosure.

FIG. 10 is a schematic cross-sectional view of a display panel according to a seventh embodiment of the disclosure. Referring to FIG. 10, a difference between a display panel 10E of the embodiment and the display panel 10 of FIG. 3 lies in different connection methods of the connecting wires and the conductive bump. To be specific, a fifth metal pattern MP5-A of a metal laminated structure MLs-A of a conductive bump CB-A of the display panel 10E has an extension portion MP5e extending toward the substrate edge 100e2. Accordingly, a transparent conductive pattern TCP2-A also has an extension portion TCP2e extending from a main body portion TCP2m toward the substrate edge 100e2. Namely, the extension portion TCP2e is located between the substrate edge 100e2 and the main body portion TCP2m.

In detail, the extension portion MP5e of the fifth metal pattern MP5-A and the extension portion TCP2e of the transparent conductive pattern TCP2-A are not overlapped with other metal patterns (for example, the first metal pattern MP1 to the fourth metal pattern MP4) along the direction Z. Therefore, a distance d1 between the extension portion TCP2e of the transparent conductive pattern TCP2-A and the substrate 100 along the direction Z is less than a distance d2 between the main body portion TCP2m and the substrate 100 along the direction Z.

Particularly, an opening OP" of an insulating layer 134A covering the pads and the conductive bump CB-A is overlapped with the extension portion TCP2e of the transparent conductive pattern TCP2-A and the extension portion MP5e of the fifth metal pattern MP5-A along the direction Z. Accordingly, a risk of disconnection or film rupture of the connecting wires WR after a film forming process (for example, a sputtering process) may be reduced, thereby ensuring the electrical connection between the connecting wires WR and the conductive bump CB-A.

Figure 11:
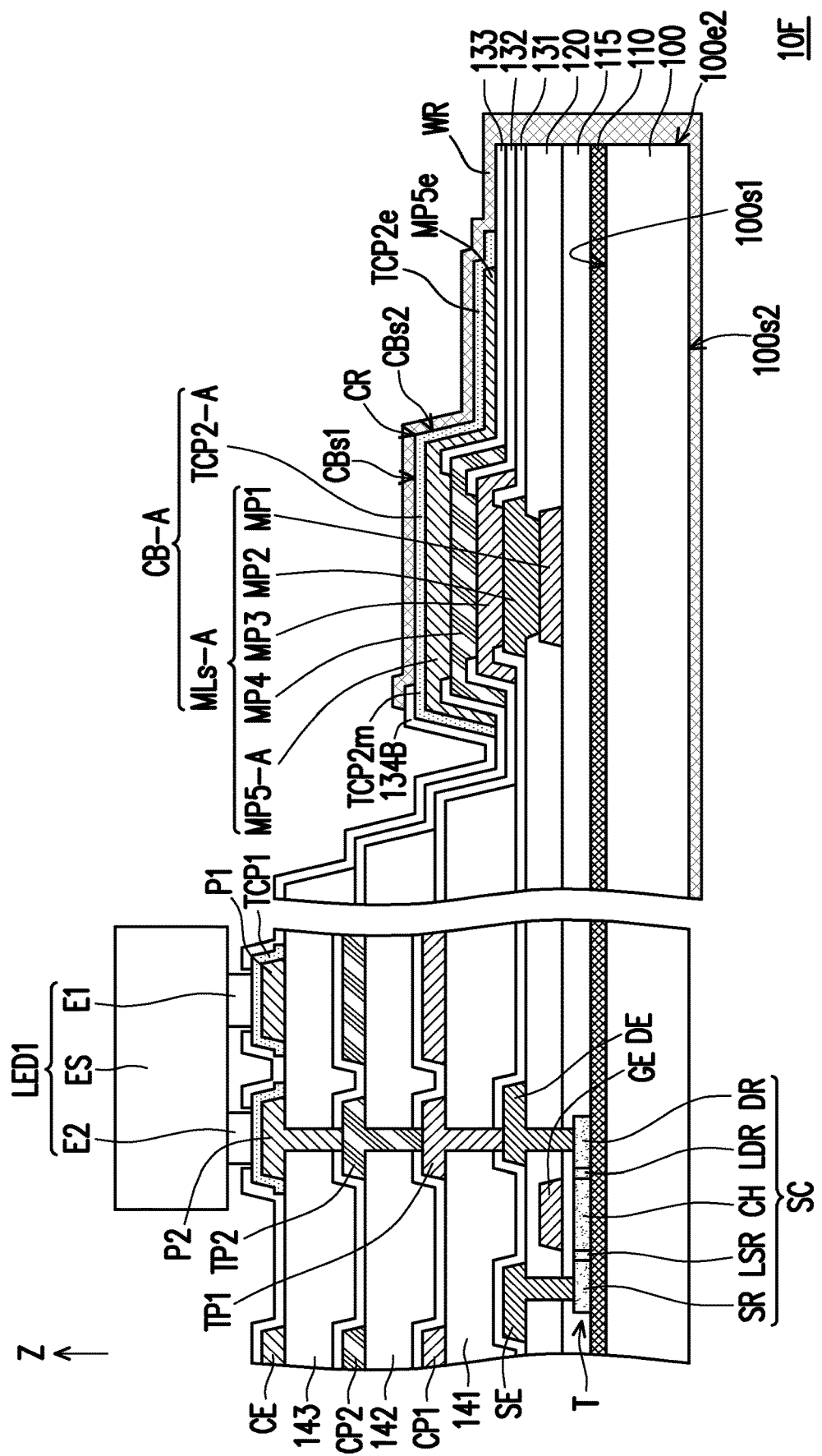
FIG. 11 is a schematic cross-sectional view of a display panel according to an eighth embodiment of the disclosure.

FIG. 11 is a schematic cross-sectional view of a display panel according to an eighth embodiment of the disclosure. Referring to FIG. 11, a difference between a display panel 10F of the embodiment and the display panel 10 of FIG. 3 lies in different connection methods of the connecting wires and the conductive bump. To be specific, an insulating layer 134B of the display panel 10F of the embodiment does not cover most of the surface CBs1 of the conductive bump CB-A, the side surface CBs2 facing the substrate edge 100e2 and the extension portion TCP2e of the transparent conductive pattern TCP2-A. Therefore, the connection wires WR and the conductive bump CB-A of the embodiment may form a better electrical connection relationship, which helps to improve a yield of a side-bonding process.

In summary, in the display panel of an embodiment of the disclosure, the dummy pattern is provided in the peripheral area between at least one edge pad located on the at least two planarization layers and closest to the substrate edge and the substrate edge. Accordingly, the situation that the edge pads cannot be correctly defined due to the loss of the photoresist material during the patterning process is avoided, thereby improving the production yield of the display panel.

What is claimed is:

1. A display panel, having a plurality of pixel areas and a peripheral area surrounding the pixel areas, the display panel comprising:
   a substrate, having a first substrate edge on a side along a first direction;
   at least two planarization layers, disposed on the substrate;
   a plurality of pads, disposed on the at least two planarization layers, and located in the pixel areas, wherein the pads comprise at least one first edge pad closest to the first substrate edge;
   a first dummy pattern, disposed on the at least two planarization layers, and extending in the peripheral area between the at least one first edge pad and the first substrate edge; and
   a plurality of light-emitting devices, electrically connected to the pads, wherein a space between the at least one first edge pad and the first substrate edge along the first direction is between 0 μm and 200 μm.

2. The display panel according to claim 1, wherein a total thickness of the at least two planarization layers is greater than or equal to 4 μm.

3. The display panel according to claim 1, wherein a width of the first dummy pattern along the first direction is greater than or equal to 5 μm.

4. The display panel according to claim 1, wherein a space between the first dummy pattern and the at least one first edge pad along the first direction is greater than or equal to 0 μm and less than or equal to 30 μm.

5. The display panel according to claim 1, wherein the first dummy pattern and the pads are of a same film layer, and part of the pads are electrically connected to the first dummy pattern.

6. The display panel according to claim 1, wherein the substrate further has a second substrate edge connected to the first substrate edge, the pads further comprise at least one second edge pad closest to the second substrate edge, and the first dummy pattern further extends between the at least one second edge pad and the second substrate edge.

7. The display panel according to claim 6, wherein the second substrate edge is located on a side of the substrate along a second direction, and a space between the first dummy pattern and the at least one second edge pad along the second direction is greater than 0 μm and less than or equal to 30 μm.

8. The display panel according to claim 6, further comprising:
   a second dummy pattern, extending between the first dummy pattern and the second substrate edge.

9. The display panel according to claim 8, wherein the second dummy pattern and the first dummy pattern are of a same film layer and are electrically connected to each other.

10. The display panel according to claim 1, wherein the substrate further has a second substrate edge, the second substrate edge and the first substrate edge are disposed opposite to each other along the first direction, the pads further comprise at least one second edge pad closest to the second substrate edge, and the display panel further comprises:
- a second dummy pattern, disposed on the at least two planarization layers, and extending between the at least one second edge pad and the second substrate edge.

11. The display panel according to claim 10, wherein the first dummy pattern, the second dummy pattern, and the pads are of a same film layer, and the first dummy pattern and the second dummy pattern are electrically independent from the pads.

12. The display panel according to claim 10, wherein a space between the second dummy pattern and the at least one second edge pad along the first direction is greater than or equal to 0 µm and less than or equal to 30 µm.

13. The display panel according to claim 1, further comprising:
- a plurality of transparent conductive patterns, respectively covering the pads; and
- a transparent dummy pattern, extending between the at least one first edge pad and the first substrate edge, wherein the transparent conductive patterns and the transparent dummy pattern are of a same film layer.

14. The display panel according to claim 13, wherein the transparent dummy pattern is not overlapped with the first dummy pattern.

15. The display panel according to claim 13, wherein at least a part of the transparent dummy pattern is overlapped with the first dummy pattern and is electrically connected to the first dummy pattern.

16. The display panel according to claim 1, wherein the substrate further has a second substrate edge connected to the first substrate edge, the pads further comprise at least one second edge pad closest to the second substrate edge, the first dummy pattern further extends between the at least one second edge pad and the second substrate edge, a side bonding area is disposed in a part of the peripheral area adjacent to the second substrate edge, and the at least two planarization layers and the first dummy pattern are not overlapped with the side bonding area.

17. The display panel according to claim 16, further comprising:
- a transparent dummy pattern, extending between the at least one first edge pad and the first substrate edge;
- a plurality of first transparent conductive patterns, respectively covering the pads; and
- a plurality of conductive bumps, disposed in the side bonding area, each of the conductive bumps having a second transparent conductive pattern, wherein the first transparent conductive patterns, the second transparent conductive pattern, and the transparent dummy pattern are of a same film layer, a first height is present between each of the first transparent conductive patterns and the substrate, a second height is present between the second transparent conductive pattern and the substrate, and the second height is less than the first height.

18. The display panel according to claim 17, further comprising:
- a plurality of connecting wires, electrically connected to the conductive bumps respectively, wherein the substrate further has a first surface and a second surface connected to the second substrate edge and being opposite to each other, and each of the connecting wires extends on the first surface, the second substrate edge, and the second surface; and
- an insulating layer, covering the pads and the conductive bumps, wherein each of the conductive bumps has a surface facing away from the substrate and a side surface, the side surface faces the second substrate edge and is connected to the surface to form a corner, the insulating layer has an opening overlapped with the corner of each of the conductive bumps, and one of the connecting wires is in direct contact with the corner through the opening.

19. The display panel according to claim 17, wherein each of the conductive bumps further has a metal laminated structure, the second transparent conductive pattern covers the metal laminated structure and is divided into a main body portion and an extension portion, the extension portion is located between the second substrate edge and the main body portion, and a first distance between the extension portion and the substrate is less than a second distance between the main body portion and the substrate.

* * * * *